(12) United States Patent
Ishikawa et al.

(10) Patent No.: US 8,508,679 B2
(45) Date of Patent: *Aug. 13, 2013

(54) SEMI-TRANSPARENT DISPLAY APPARATUS

(75) Inventors: Tomohiro Ishikawa, Evanston, IL (US); Thomas Gitzinger, Libertyville, IL (US)

(73) Assignee: Motorola Mobility LLC, Libertyville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/277,242

(22) Filed: Oct. 20, 2011

(65) Prior Publication Data

US 2012/0268669 A1    Oct. 25, 2012

Related U.S. Application Data

(62) Division of application No. 12/058,182, filed on Mar. 28, 2008, now Pat. No. 8,054,391.

(51) Int. Cl.
*G02F 1/1335*        (2006.01)

(52) U.S. Cl.
USPC ............................................ 349/12; 349/115

(58) Field of Classification Search
USPC .................................. 349/12, 115; 345/173
See application file for complete search history.

(56) References Cited

U.S. PATENT DOCUMENTS

| | | | |
|---|---|---|---|
| 5,543,588 A | 8/1996 | Bisset et al. | |
| 5,729,219 A | 3/1998 | Armstrong et al. | |
| 5,896,575 A | 4/1999 | Higginbotham et al. | |
| 5,959,260 A | 9/1999 | Hoghooghi et al. | |
| 6,597,347 B1 | 7/2003 | Yasutake | |
| 6,597,418 B2 | 7/2003 | Moon et al. | |
| 6,927,747 B2 | 8/2005 | Amizadeh et al. | |
| 6,947,114 B2 | 9/2005 | Yamada et al. | |

(Continued)

FOREIGN PATENT DOCUMENTS

| | | |
|---|---|---|
| JP | 1993324122 A | 12/1993 |
| JP | 2001013898 A | 1/2001 |

(Continued)

OTHER PUBLICATIONS

Gingichashvilli, Sarah: "New Transparent Electroluminescent Displays", The Future of Things, Monday, Oct. 22, 2007, 2htt:://www.tfot.info/news/1028/new-transparent-electroluminescent-displays.html, (Oct. 22, 2007).

(Continued)

*Primary Examiner* — Dung Nguyen
(74) *Attorney, Agent, or Firm* — Gary J. Cunningham

(57) ABSTRACT

A semitransparent display (100), suitable for use with an electronic device (700), is provided. The semitransparent display (100), in one embodiment, includes a cholesteric liquid crystal display layer (101) and a translucent electroluminescent layer (102), such as an organic light emitting diode device. Control circuitry (109) is coupled to each layer, and is configured to selectively actuate each layer. The cholesteric liquid crystal display layer (101) can be operated in any of a planar mode (201), a focal conic mode (202), or a homeotropic mode (203). Segments of the cholesteric liquid crystal display layer (101) can be selectively actuated so as to hide and reveal user actuation targets. Capacitive sensors (620, 621) can be included so that the semitransparent display (100) works as a touch sensitive user interface. A user can see an object, such as a hand (105) or stylus, from above the semitransparent display (100) when the hand (105) or stylus is placed beneath the semitransparent display (100).

17 Claims, 5 Drawing Sheets

(56) References Cited

U.S. PATENT DOCUMENTS

| | | |
|---|---|---|
| 6,987,547 B2 | 1/2006 | Yang et al. |
| 6,989,875 B2 | 1/2006 | Yoon |
| 7,027,118 B1 | 4/2006 | Wu et al. |
| 7,075,513 B2 | 7/2006 | Silfverberg et al. |
| 7,148,513 B2 | 12/2006 | He et al. |
| 7,205,959 B2 | 4/2007 | Henriksson |
| 7,236,151 B2 * | 6/2007 | Doane et al. .................... 345/87 |
| 8,054,391 B2 * | 11/2011 | Ishikawa et al. ................ 349/12 |
| 2003/0184528 A1 | 10/2003 | Kawasaki et al. |
| 2004/0169624 A1 | 9/2004 | Yamazaki et al. |
| 2004/0263056 A1 | 12/2004 | Seo et al. |
| 2005/0024339 A1 | 2/2005 | Yamazaki et al. |
| 2006/0092355 A1 | 5/2006 | Yang et al. |
| 2006/0284853 A1 | 12/2006 | Shapiro |
| 2007/0075915 A1 | 4/2007 | Cheon et al. |
| 2007/0085838 A1 | 4/2007 | Ricks et al. |
| 2007/0103454 A1 | 5/2007 | Elias |
| 2007/0177803 A1 | 8/2007 | Elias et al. |
| 2008/0239174 A1 * | 10/2008 | Ishii et al. ....................... 349/12 |
| 2008/0316395 A1 * | 12/2008 | O'Keeffe ......................... 349/88 |
| 2009/0009710 A1 * | 1/2009 | Nirmal et al. ................. 349/176 |
| 2010/0277420 A1 | 11/2010 | Charlier et al. |
| 2010/0277421 A1 | 11/2010 | Charlier et al. |
| 2010/0277439 A1 | 11/2010 | Charlier et al. |

FOREIGN PATENT DOCUMENTS

| | | |
|---|---|---|
| JP | 2003149685 A | 5/2003 |
| WO | 9838822 A1 | 9/1998 |
| WO | 2008030563 A2 | 3/2008 |

OTHER PUBLICATIONS

Wigdor, Daniel et al: "LucidTouch: A See-Through Mobile Device", UIST'07, Oct. 7-10, 2007, Newport, Rhode Island, USA.

Erh-Li (Early) Shen et al., "Double-side Multi-touch Input for Mobile Devices", CHI 2009—Spotlight on Works in Progress, Apr. 4-9, 2009, pp. 4339-4344, Boston, MA, USA.

* cited by examiner

SEMI-TRANSPARENT DISPLAY APPARATUS

BACKGROUND

1. Technical Field

This invention relates generally electronic display devices, and more particularly to a semitransparent display using a cholesteric liquid crystal display layer, with which a person can see an object beneath the display while the display is active.

2. Background Art

Portable electronic devices are becoming ever more popular. It seems as though everyone today has a mobile telephone. Additionally, other electronic devices such as portable computers, portable gaming devices, multimedia or music players, navigation devices, and the like are becoming more prevalent.

Advances in technology have made these devices more convenient to use. Reductions in overall size, for example, allow a mobile telephone to fit in a shirt pocket. Advances in processing power permit complex computational tasks to be performed in a palm-sized computer. Advances in networking technology permit gaming devices to connect to the Internet. Touch sensitive screens permit users to navigate the features of a mobile telephone or palm computer without a conventional keypad.

Sometimes, however, certain advances come with tradeoffs. Take, for instance, the touch sensitive screen. While touch sensitive screens are convenient in that many different displays can be presented to a user, user interaction efficiency can actually be reduced due to the fact that the user's finger or hand is often covering the display itself. Consider this example: In a palm-sized touch sensitive device, multiple icons are presented upon the display from which a user may make a feature selection. Once a feature—such as a music player, camera, or phone—is selected, the user may begin to use the feature by selecting various controls from a series of menus and so forth. Each time the user makes a motion to select an icon or menu or control, they must move at least a finger—and more often a portion of their hand—over the display. As such, they may temporarily lose visibility of 10%, 30%, or more of the overall display. To be able to see the display again, they must move their hand out of the way again. This overall moving of the hand back and forth can lead to reduced user interaction efficiency.

There is thus a need for an improved display device that, when used with touch sensitive displays for example, permits the user to interact with the display with increased user interaction efficiency.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
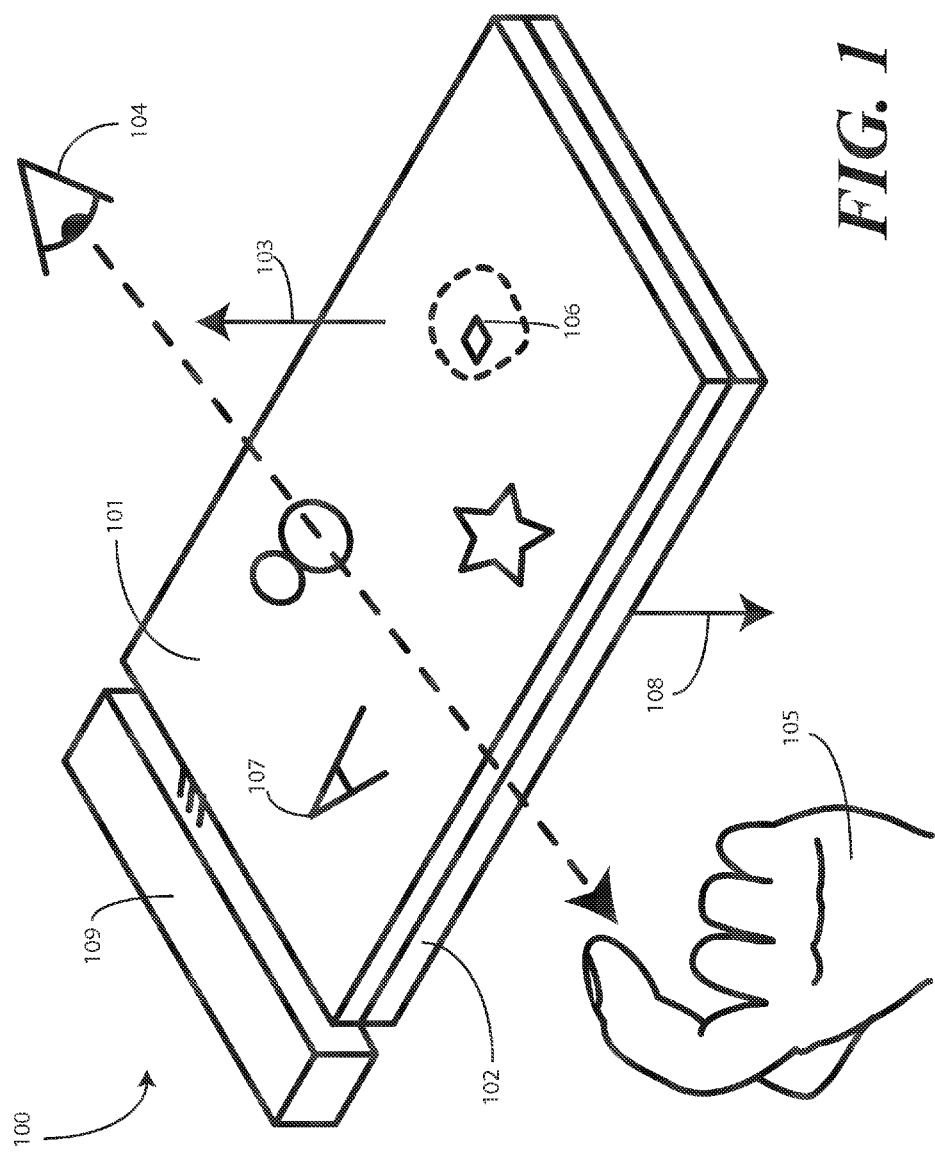
FIG. 1 illustrates one embodiment of a semitransparent display in accordance with the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of apparatus components related to a semi-transparent display employing a cholesteric liquid crystal display layer. Accordingly, the apparatus components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of the semi-transparent display. For example, where the semi-transparent display is integrated into a touch sensitive user interface, processors or certain non-processor circuits may be used to control the operation of capacitive sensors used to detect the touch of a user's stylus or finger. The non-processor circuits may include, but are not limited to, microprocessors, programmable logic circuits, memory devices, signal drivers, clock circuits, and power source circuits. As such, these functions may be interpreted as steps of a method to perform the operation of such devices. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and circuits with minimal experimentation.

Embodiments of the invention are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the present invention employ a combination of a translucent electroluminescent display layer and a cholesteric liquid crystal display layer to provide a semi-transparent display layer. A user operating the semi-transparent display layer is able to see objects—such as a hand or stylus—positioned beneath the display when the display is active. In one embodiment, one or more capacitive touch sensors are included so that the semi-transparent display works as a touch-sensitive display. In such a configuration, a user may actuate various icons and user actuation targets from the bottom of the display, thereby leaving the entire display visible to the user while being actuated.

Various types of light sources can be used as the translucent electroluminescent layer, including organic light emitting diode displays and transparent and segmented electroluminescent displays. Further, by selective disposition of the electrodes used to actuate these devices, icons, keys, and user actuation targets can be presented by the translucent luminescent layer. Since light is being emitted by the translucent electroluminescent layer, and not by an array of multiplexed light emitting diodes as is the case in some prior art systems, this layer can be used as a blanket light emission source.

In one embodiment, the emission band of translucent electroluminescent layer can be adjusted to optimize the visibility through the cholesteric liquid crystal display. Further, operation of the semi-transparent display can occur both when the translucent electroluminescent layer is active and when it is inactive. For instance, in the high ambient light conditions, the translucent electroluminescent layer can be off while the cholesteric liquid crystal display presents display indicia to the user. Characters, icons, or user actuation targets are presented to the user, in one embodiment, when portions of the cholesteric liquid crystal display are in a reflective state. In low ambient light conditions, the translucent electroluminescent device is active. When active, the translucent electroluminescent device can project light both beneath the semi-transparent display and through translucent portions of the cholesteric liquid crystal display. In so doing, the translucent electroluminescent device can illuminate objects, such as a hand or stylus, beneath the display or present visible graphical indicia to a user. Further, light may pass through partially transparent sections of the cholesteric liquid crystal display to prevent graphical information as well.

Turning now to FIG. 1, illustrated therein is one embodiment of a semitransparent display 100 in accordance with the invention. The semitransparent display 100 includes a cholesteric liquid crystal display layer 101 and a translucent electroluminescent layer 102. In one embodiment, the translucent electroluminescent layer 102 is disposed beneath the cholesteric liquid crystal display layer 101 such that light 103 projected from the translucent electroluminescent layer 102 through the cholesteric liquid crystal display layer 101 will reach the user's eye 104. Further, light 103 projected from the translucent electroluminescent layer 102 will also project beneath the semitransparent display 100, thereby illuminating objects like a user's hand 105. As the semitransparent display 100 is semi-transparent in many modes of operation, the object beneath the translucent electroluminescent layer 102 is visible to the user's eye 104 when being illuminated by the translucent electroluminescent layer 102.

The cholesteric liquid crystal display layer 101, in one embodiment, comprises a pair of substrates with cholesteric liquid crystal material disposed therebetween. Cholesteric liquid crystals are chiral, twisted molecules with a high degree of order along one axis. Along that axis they are periodic. Cholesteric liquid crystal displays can operate in at least three different modes: planar or "reflective"; focal conic or "hazy transparent"; and homeotropic or "low-haze transparent." Both the planar and focal conic modes are stable modes, in that once the cholesteric liquid crystal material is set in that mode, it remains in that mode even with the absence of power. The homeotropic mode requires the application of power to retain the homeotropic state. The amount of power required, however, is relatively small.

The reflective mode of a cholesteric liquid crystal occurs when the liquid crystal is in the planar state. The hazy transparent mode of a cholesteric liquid crystal occurs when the liquid crystal is in the focal conic state. The low-haze transparent mode of cholesteric liquid crystal occurs when the liquid crystal is in the homeotropic state. The cholesteric liquid crystals can be switched from one mode to another with application of a pulse of voltage. As an example, a 50 V pulse for 10 to 20 msec is sufficient for mode switching of cholesteric liquid crystals.

Figure 2:
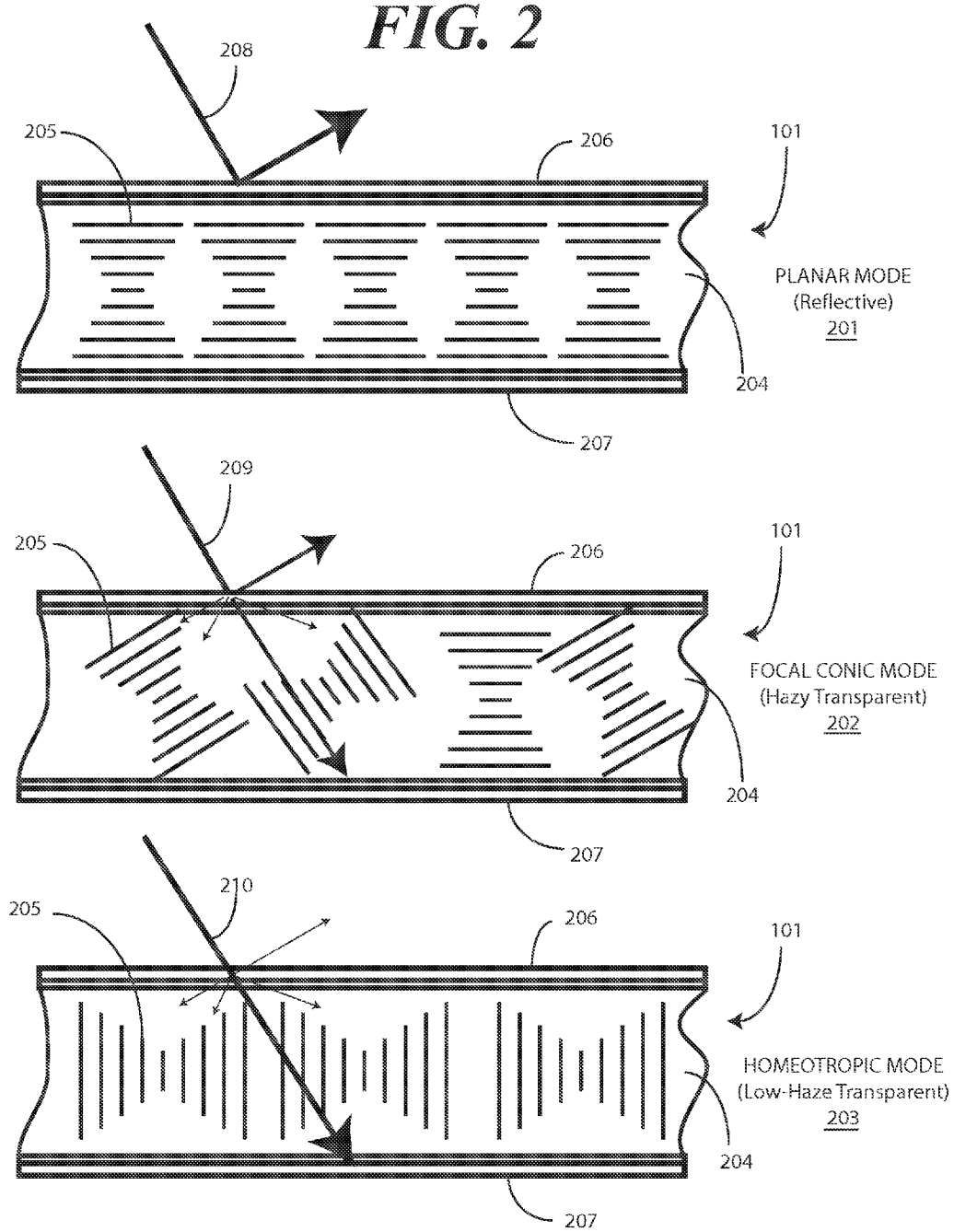
FIG. 2 illustrates various modes of operation of a cholesteric liquid crystal display layer in accordance with embodiments of the invention.

Turning briefly to FIG. 2, illustrated therein are the various modes of a cholesteric liquid crystal display layer 101 in accordance with embodiments of the invention. The various views of FIG. 2 illustrate a side cut-away view of a cholesteric liquid crystal display layer 101 in a planar state 201, a focal conic state 202, and a homeotropic state 203.

The cholesteric liquid crystal medium 204 comprises cholesteric molecules 205 disposed between a first substrate layer 206 and a second substrate layer 207. Each of the substrate layers 206,207 can include a conductor layer, which can comprise a plurality of pellucid electrodes as will be described below. Each substrate layer, in one embodiment, is made of a transparent barrier material, such as glass for example.

The cholesteric liquid crystal medium 204, in one embodiment, includes a liquid crystal composition along with chiral doping agents to produce molecules having a spiral pitch induction. In one embodiment, a single cholesteric liquid crystal layer has such a pitch associated therewith, and this pitch is configured to reflect a predetermined spectrum of light. By way of example, the cholesteric liquid crystal medium 204 may have a pitch corresponding to yellow light being reflected.

In the planar mode 201, the molecules 205 have a common alignment. Thus, certain wavelengths (e.g., yellow as set forth in the preceding paragraph) of light 208 incident to the cholesteric liquid crystal medium 204 are reflected and can been seen by a user. To permit light to transmit through the medium in the focal conic mode 202, an electric field is utilized to randomize molecule orientation, as shown in FIG. 2. By randomizing the molecule orientation, or at least reorienting them so as to not be reflective at the angle normally viewed by a user, incident light 209 passes through the medium and may be reflected by something behind or below the medium, such as the user's hand (105) or stylus, which is then seen by the user.

The wavelength of light reflected by the medium may be determined by selecting the spiral pitch through the use of chiral doping agents, as is known in the art. Further, a designer of embodiments of the invention can also select the color of light projected by the translucent electroluminescent layer (102). As such, in accordance with one embodiment of the invention, light passing through a focal conic section of the cholesteric liquid crystal display layer 101 may appear to be a first color, while light reflecting off a planar section of the cholesteric liquid crystal display layer 101 may appear to be a second color.

Once the voltage applied to the cholesteric liquid crystal medium 204 exceeds a predetermined threshold associated with the medium, the helical structure of the molecules 205 in the focal conic mode 202 become untwisted. The directors of each molecule 205 then orient themselves perpendicular to the substrates 206, thereby causing the homeotropic mode 203. In the homeotropic mode 203, the cholesteric liquid crystal medium 204 is essentially transparent to incident light 210. As noted above, however, to keep the cholesteric liquid crystal medium in the homeotropic mode 203, power must be continually applied to the cholesteric liquid crystal display layer 101.

Referring again to FIG. 1, voltage is applied to the cholesteric liquid crystal material by pellucid electrodes 106 disposed along one or both substrates of the cholesteric liquid crystal display layer 101. (These electrodes can comprise the conductor layers described with FIG. 2. For instance, at least one of the conductor layers can include character-shaped or pixel-shaped conductor elements for forming characters, symbols, images, or other indicia to be displayed to the user. Another conductor layer may serve as a common electrical plane.)

One method of forming the pellucid electrodes 106 is by printing solid indium-tin oxide (In.sub.2 O.sub.3 SnO.sub.2) (ITO) in the desired pattern atop the substrate of the cholesteric liquid crystal display layer 101. Indium tin oxide is a mixture of indium oxide and tin oxide. In at least some formulations, indium tin oxide is substantially transparent and conductive, and is capable of being deposited in thin layers by way of a printing process. Indium tin oxide is well suited for embodiments of the present invention due to its combination of electrical conduction properties and optical transparency. The pellucid electrodes 106 can be deposited on the substrate in any of a variety of ways, including electron beam evaporation, physical vapor deposition, or other various sputter deposition techniques. In addition to indium-tin oxide, other materials, including patterned conductive inks, may also used in the capacitor electrode construction.

Where the pellucid electrodes 106 are deposited on the substrates as pixels, characters, icons, or other graphical indicia, the cholesteric liquid crystal display layer 101 can be used to present user actuation targets 107 or other graphical indicia to the user's eye 104 by changing segments of the cholesteric liquid crystal display layer 101 between the various modes. For instance, when one segment of the cholesteric liquid crystal display layer 101 is in the planar state and other segments are in the focal conic or homeotropic states, graphical indicia is presented to the user's eye 104. In sufficiently lighted environments, this occurs regardless of the state of the translucent electroluminescent layer 102. In low-light environments, the graphical indicia would also be visible, in that light 103 projected through the focal conic or homeotropic segments would reach the user's eye 104 while being reflected in the planar segments. Other combinations of modes may also be used to present graphical indicia.

Multiple devices are suitable for use as the translucent electroluminescent layer 102. For instance, in one embodiment, the translucent electroluminescent layer 102 comprises an organic light emitting diode display. Organic light emitting diode displays, commonly referred to as "OLEDs", are light emitting diodes having multiple organic layers including electroluminescent layer. These layers are typically formed by vacuum deposition. In an alternative form, organic light emitting diode displays can be formed from layers of polymeric compounds. The compounds are deposited on substrates by way of a printing process. Organic light emitting diodes are capable of emitting light in a plurality of colors.

One feature of organic light emitting diode displays that is beneficial to embodiments of the present invention is that they do not require a backlight. Other features are that they are thin, easily manufactured, and do not draw relatively large amounts of power. One of the most attractive features for use with embodiments of the present invention, however, is that they can be made pellucid or semi-transparent such that a user can see through them both when they are on and when they are off. For example, in one embodiment of the present invention, the combination of the cholesteric liquid crystal display layer 101 and the translucent electroluminescent layer 102 are at least twenty-five percent transmissive when the cholesteric liquid crystal display layer 101 (in a display region designed to present information to the user's eye 104) is not in a planar state, i.e., when the cholesteric liquid crystal display layer 101 is either in a focal conic state or a homeotropic state. Organic light emitting diode displays are easily able to achieve this transmissivity.

Other electroluminescent devices, in addition to organic light emitting diode devices, can also be used as the translucent electroluminescent layer 102. For instance, transparent and segment electroluminescent displays can be used. One example of such a display is the transparent and segment electroluminescent displays (sometimes referred to as "TASEL" displays) offered by Planar Systems Inc. These displays are transparent, both when OFF and when ON. Further, they can be manufactured in different geometric shapes. Additionally, holes and other apertures can appear across these displays. They have a wide viewing angle and a wide operating temperature.

Regardless of the type of display used as the translucent electroluminescent layer 102, the electrodes used to make segments of the translucent electroluminescent layer 102, as with the cholesteric liquid crystal display layer 101, can be configured to present icons, graphics, text, and so forth to the user's eye. This can be done by configuring the electrodes of the translucent electroluminescent layer 102 in predetermined segments or pixels. Thus, in a semitransparent display 100 in accordance with embodiments of the invention, any of the cholesteric liquid crystal display layer 101, the translucent electroluminescent layer 102, or both can be used to present graphical indicia, characters, or user actuation targets to the user's eye 104.

Control circuitry 109, which can include a microprocessor, programmable logic, or other control device, is coupled to the cholesteric liquid crystal display layer 101 and the translucent electroluminescent layer 102. The control circuitry 109 may execute commands in the form of embedded firmware when operating the various layers. The control circuitry 109 can be configured as a separate controller for each layer, or as one controller capable of controlling both layers. In one embodiment, the control circuitry 109 is configured to selectively actuate segments, pixels, or regions of each of the cholesteric liquid crystal display layer 101 and the translucent electroluminescent layer 102. In one embodiment, either or both of the cholesteric liquid crystal display layer 101 and the translucent electroluminescent layer 102 are matrix addressable, such that the control circuitry 109 can selectively actuate specific regions of either layer.

Figure 3:
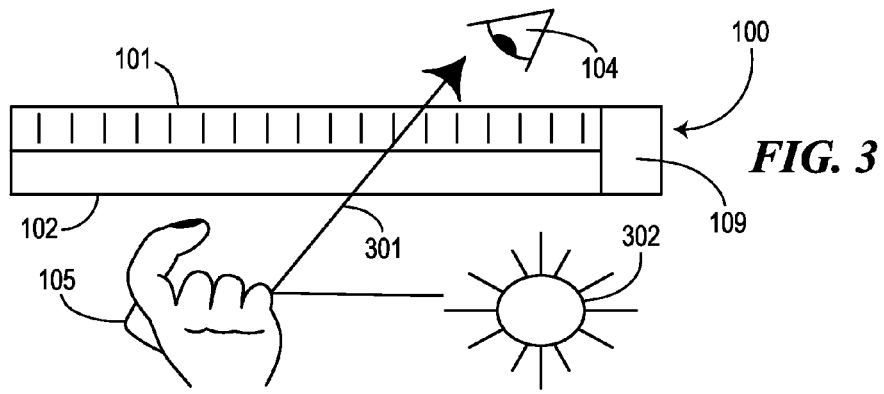
FIGS. 3-5 illustrate various modes of operation of embodiments of a semitransparent display in accordance with the invention.
Figure 4:
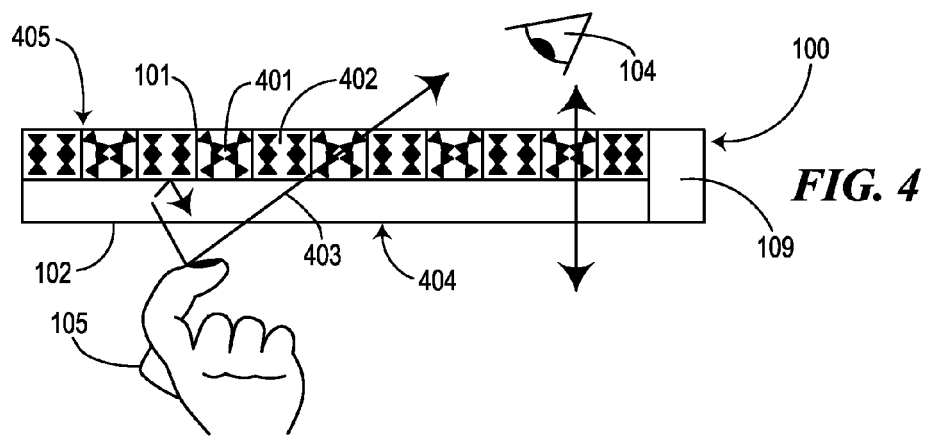
Figure 5:
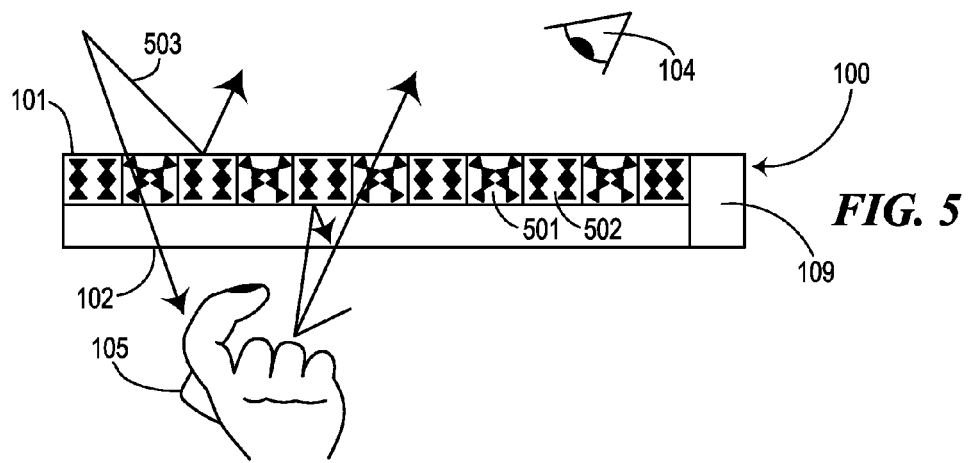

Turning now to FIGS. 3-5, exemplary modes of operation of a semitransparent display 100 in accordance with embodiments of the invention will be illustrated. It will be clear to those of ordinary skill in the art having the benefit of this disclosure, however, that these modes are intended to be illustrative only, as other applications for semitransparent displays in accordance with embodiments of the invention will be apparent as well.

As will be shown in FIGS. 3-5, the control circuitry 109 can be configured to operate portions of the cholesteric liquid crystal display layer 101 in various modes when some or all of the translucent electroluminescent layer 102 is ON. Further, the control circuitry 109 can be configured to operate portions of the cholesteric liquid crystal display layer 101 in the same or other modes when some or all of the translucent electroluminescent layer 102 is OFF. The actuation of the translucent electroluminescent layer 102 may be predicated upon the amount of ambient light incident to the semitransparent display 100. The actuation of the translucent electroluminescent layer 102 may also be predicated upon whether the translucent electroluminescent layer 102 is being used as a general lighting device or to present certain graphical indicia to the user.

By way of example, in one embodiment, the control circuitry 109 is configured to operate portions of the cholesteric liquid crystal display layer 101 in one of the homeotropic mode (203) or the focal-conic mode (202) when the translucent electroluminescent layer 102 is OFF so as to present graphical indicia to a user. In another embodiment, the control circuitry 109 is configured to operate portions of the cholesteric liquid crystal display layer 101 in the planar mode (201), and other portions of the cholesteric liquid crystal display layer 101 in one of the focal-conic mode (202) or the homeotropic mode (203) when the translucent electroluminescent layer 102 is ON. In another embodiment, the control circuitry 109 is configured to operate portions of the cholesteric liquid crystal display layer 101 in the planar mode (201), and other portions of the cholesteric liquid crystal display layer 101 in one of the focal-conic mode (202) or the homeotropic mode (203) when the translucent electroluminescent layer 102 is OFF.

Beginning with FIG. 3, illustrated therein is the semitransparent display 100 with the cholesteric liquid crystal display layer 101 in the homeotropic mode (203) and the translucent electroluminescent layer 102 not illuminated or OFF. This mode of operation is suitable for both high and low ambient light situations. In this configuration, objects such as a user's hand 105 disposed beneath the semitransparent display 100 are visible to the user's eye 104 when positioned above the semitransparent display 100. This is the case because light 301 from background sources 302 reflects off objects beneath the semitransparent display 100 and pass to the user's eye 104. While the cholesteric liquid crystal display layer 101 can be operated in the homeotropic mode (203) as shown, note that it could also be in the focal conic mode (202). The difference would be a slight reduction in the amount of light that passes through the semitransparent display 100.

Turning now to FIG. 4, illustrated therein is an alternate mode of operation. In FIG. 4, the translucent electroluminescent layer 102 is ON and thus emits light. Graphical indicia or other information can be presented to the user's eye via the differing colors and light intensities passing through the various segments 401,402 of the cholesteric liquid crystal display layer 101. By way of example, segment 401 is in the focal conic mode (202), while segment 401 is in the planar mode (201). Note that the homeotropic mode (203) could be used in place of the focal conic mode (202) in FIG. 4.

When an object, such as a user's hand 105, is placed within a sufficiently close proximity with the translucent electroluminescent layer 102, light 403 from this layer is reflected off the object and passes through segments 401 of the cholesteric liquid crystal display layer 101 that are in the focal conic mode (202). Said differently, when the translucent electroluminescent layer 102 is ON, light 403 from the translucent electroluminescent layer 102 projects through the bottom display section 404 and through portions of the top display section 405 where the cholesteric liquid crystal display layer 101 is in either the focal-conic mode or the homeotropic mode. As such, the user's hand 105 is visible through the semitransparent display 100. It may appear to have a texture, due to the focal conic properties of the cholesteric liquid crystal display layer 101, but will be visible to the user's eye 104 nonetheless. The configuration of FIG. 4 is suitable for low ambient light situations.

Turning now to FIG. 5, illustrated therein is a mode of operation suitable for a high ambient light environment. In FIG. 5, the translucent electroluminescent layer 102 is OFF and does not emit light. Segments 501,502 of the cholesteric liquid crystal display layer 101 can be operated in the focal conic mode (202) and planar mode (201), respectively. As each of these states is bistable, there is no power required from the control circuitry 109 to present graphical indicia or images to the user's eye 104. The graphical indicia are viewed from reflected light 503 from the planar mode segments. When objects such as the user's hand 105 are placed beneath the semitransparent display 100, it will be visible to the user through the focal conic mode segments.

Note that in some particular environments, ambient light from background sources may interfere with reflected light so as to reduce the overall contrast ratio of the semitransparent display. However, this situation is easily remedied by adjusting the transmissivity of the translucent electroluminescent layer 102 to enhance the contrast. Experimental results have shown that a transmissivity of about 30% is sufficient for an adequate contrast ratio.

Figure 6:
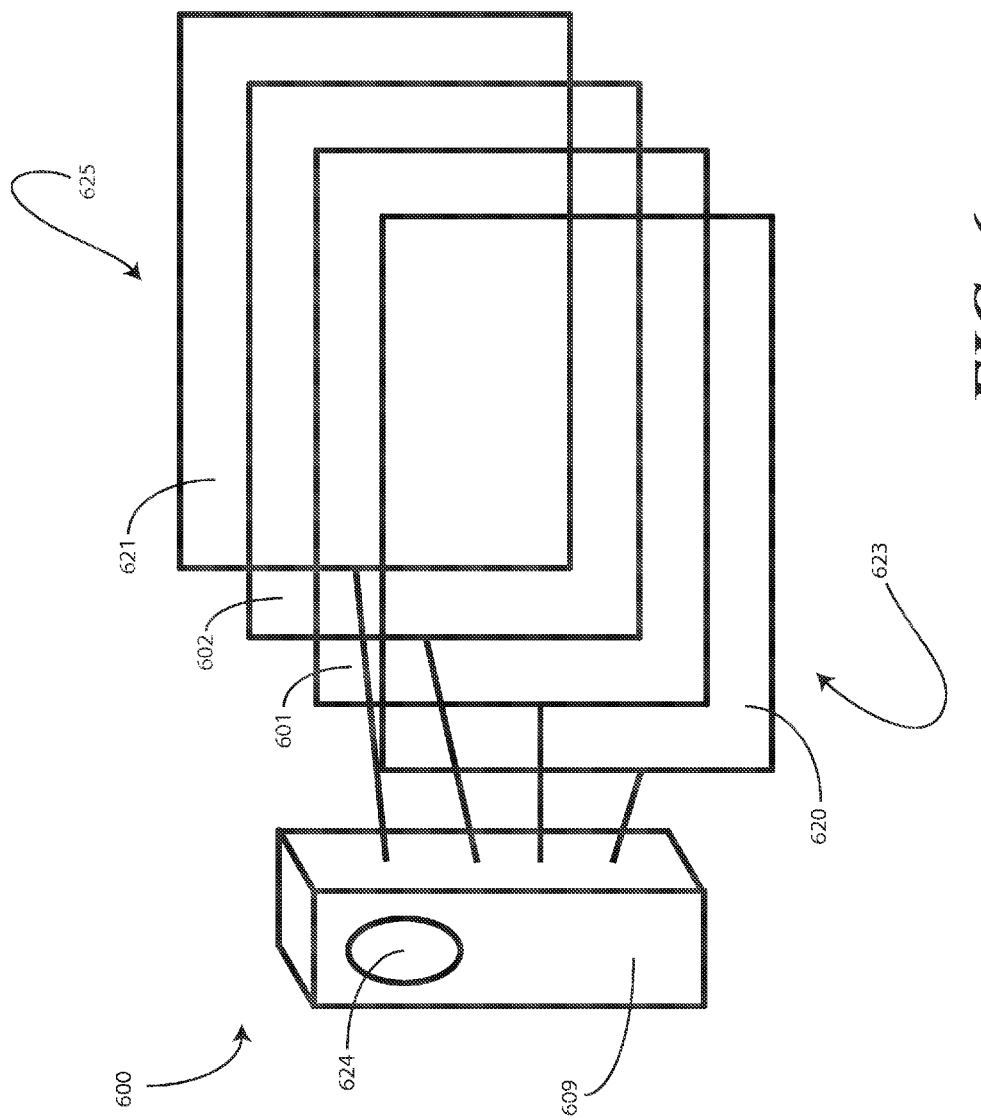
FIG. 6 illustrates a touch sensitive semitransparent display in accordance with embodiments of the invention.

Turning now to FIG. 6, illustrated therein is one embodiment of a semitransparent display 600 in accordance with the invention. As with FIG. 1, the semitransparent display 600 includes a cholesteric liquid crystal display layer 601 and a translucent electroluminescent layer 602. However, the embodiment of FIG. 6 is configured to function as a touch sensitive display, and therefore includes one or more capacitive touch sensors that are disposed along the semitransparent display 600 and are coupled to the control circuitry 609.

The embodiment of FIG. 6 is suitable for serving as a touch sensitive user interface for an electronic device. For example, electronic tablets, computers, mobile telephones and the like may use embodiments of the semitransparent displays described herein as user interface devices. In one embodiment, a semitransparent display can be used on in a mobile phone as a touch-sensitive display. For example, in a flip-type phone, the semitransparent display can be incorporated into the upper flip portion such that a user's finger or stylus is visible from above the touch sensitive interface when the user's finger or stylus is positioned beneath the touch sensitive interface.

In the exemplary embodiment of FIG. 6, two capacitive touch sensors 620,621 are used. It will be clear to those of ordinary skill in the art having the benefit of this disclosure that one capacitive touch sensor may be used without the other. In one embodiment, the semitransparent display 600 is configured to be actuated from at least the bottom. As such, one capacitive sensor 621 is configured to detect objects contacting the bottom display section 625. Where the semitransparent display 600 is capable of actuation from the top or the bottom, a capacitive sensor 620 may be placed along a top display section 623 so as to detect objects contacting the top display section.

There are many technologies suitable for use as touch sensors in accordance with embodiments of the present invention. Capacitive touch sensors are but one exemplary technology. In capacitive sensing technologies, capacitive touch sensors detect the presence of an object, such as a finger or stylus, by determining a changing current flow at the contact point. Exemplary capacitive sensors are taught in, for example, U.S. Pat. Nos. 4,071,691, 4,129,747, 4,198,539, 4,293,734, 4,302,011, 4,371,746, and 4,430,917.

In one embodiment, each of the capacitive sensors 620,621 includes a plurality of capacitive sensing devices disposed along a substrate. Each of the plurality of capacitive sensing devices comprises a layer of capacitor sensor material. In one embodiment, suitable for use with embodiments of the present invention, the substrate is configured to transmit incident light. By way of example, the substrate may be manufactured from thin plastic film, sheet plastic, or reinforced glass. When the capacitive sensors 620,621 are employed in an electronic device, each of the plurality of capacitive sensing devices is configured, in conjunction with associated control circuitry, to detect an object in close proximity with—or touching—either the top display section 623 or the bottom display section 625.

The layer of capacitive sensor material is electrically conductive, and, in one embodiment, is pellucid. The layer of capacitive sensor material is arranged as a plurality of capacitive electrodes. One method of forming the transparent or at least semi-transparent plurality of capacitive sensing devices is by printing indium-tin oxide in the desired capacitor device patterns atop the substrate. The plurality of capacitive sensing devices may be deposited on the substrate in any of a variety of ways, including electron beam evaporation, physical vapor deposition, or other various sputter deposition techniques. In addition to indium-tin oxide, other materials, including patterned conductive inks, may also used in the capacitor electrode construction.

In addition to the capacitive sensors 620,621, in one embodiment the semitransparent display assembly further includes an ambient light detector 624. The ambient light detector 624, which can be coupled to the control circuitry 609, is configured to detect an amount of ambient light incident upon the assembly, and to convert that measurement of ambient light to an electronic signal suitable for the control circuitry 609. Numerous photodetectors and optical sensors suitable for use as the ambient light detectors are known to those of ordinary skill in the art. These devices include semiconductor sensors and other photodetector circuits.

The ambient light detector 624 can be used, in one embodiment, to determine when to actuate the translucent electroluminescent layer 602. For example, when the ambient light detector 624 detects bright light conditions, such as sunlight or ample indoor lighting, the control circuitry 609 can be configured to turn the translucent electroluminescent layer 602 OFF. In low light conditions, such as outdoor nighttime settings or low indoor light environments, the control circuitry 609 can be configured to turn the translucent electroluminescent layer 602 ON. Said differently, when the ambient light detected by the ambient light detector 624 is above a predetermined threshold, the control circuitry—in one embodiment—is configured to deactivate the translucent electroluminescent layer 602.

Figure 7:
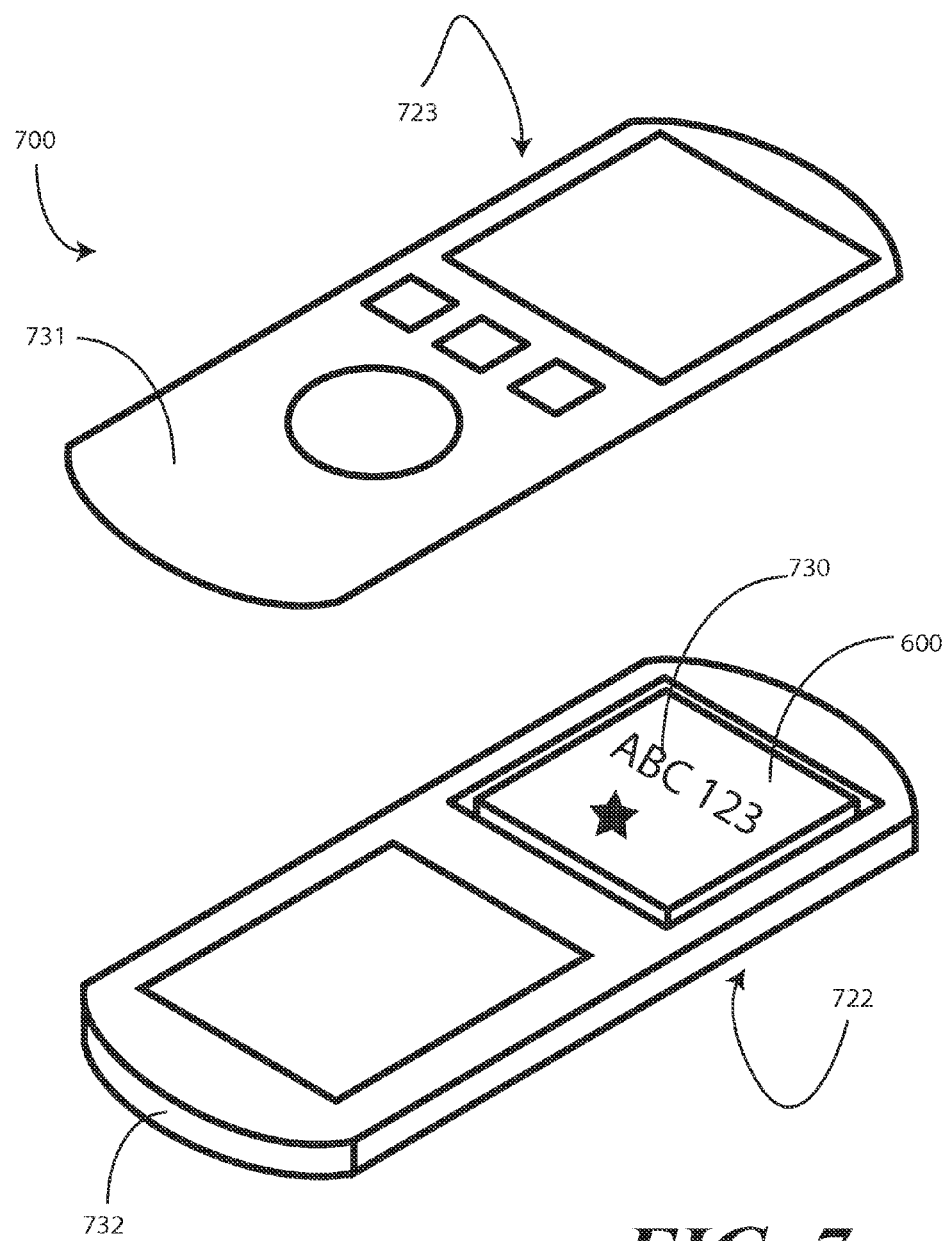
FIG. 7 illustrates an electronic display having a semitransparent display in accordance with embodiments of the invention.

Turning now to FIG. 7, illustrated therein is one embodiment of an electronic device 700 having a touch sensitive user interface comprising a semitransparent display 600 in accordance with the invention. The semitransparent display 600 includes both a cholesteric liquid crystal display layer (601) and a translucent electroluminescent layer (602). In this illustrative embodiment, the semitransparent display 600 is configured as a touch sensitive user interface, and thus includes capacitive sensors (620, 621) configured to detect a proximate position of an object relative to the touch sensitive user interface. As two capacitive sensors (620, 621) are employed in this example (note that only one or no capacitive sensors can be used), the capacitive sensors (620, 621) are configured to detect a proximate position of an object either above the touch sensitive user interface, beneath the touch sensitive interface, or combinations thereof.

In one embodiment, the semitransparent display 600 is configured to selectively hide or reveal one or more user actuation targets 730 to a user. As noted above, this can be done by actuating the cholesteric liquid crystal display layer (601), the translucent electroluminescent layer (602), or combinations thereof. In one embodiment, the one or more user actuation targets 730 are selectively presented to the user by transitioning segments of the cholesteric liquid crystal display layer (601) to the planar mode (201). The user actuation targets 730 are then hidden by returning the segments of the cholesteric liquid crystal display layer (601) to the focal conic mode (202) or the homeotropic mode (232).

In the electronic device 700 of FIG. 7, the touch sensitive user interface is at least capable of actuation along the lower surface 722 of the semitransparent display 600. Further, when the translucent electroluminescent layer (602) is actuated, it is configured to selectively project light through the upper surface 723 and the lower surface 722 of the semitransparent display 600. In one embodiment, to accommodate this transmission, the cholesteric liquid crystal display layer (601) has a transmissivity of fifty percent or more when the cholesteric liquid crystal display layer (601) is in the focal-conic mode (202) or the homeotropic mode (203). A thin fascia member 731, which can be constructed of plastic, thin film, or glass, can be used to seal the semitransparent display 600 and other components of the electronic device 700 within the device's housing 732.

As described herein, embodiments of the present invention provide a semitransparent display a combination of both a generally transparent cholesteric liquid crystal display layer and a translucent backlight source to achieve at least a twenty-five percent transmission state in one or more modes of operation. Embodiments of the present invention can be used as overlay components for input devices, such as keypads on electronic devices for example. In one embodiment, the semitransparent display uses a cholesteric liquid crystal display device and an organic light emitting diode device. The light source, in one embodiment, does not have to be multiplexed and thus can be used in certain applications as a blanket emission source. The emission band of the light source can be adjusted to optimize the visibility.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A device having a semitransparent display, the semitransparent display comprising:
a cholesteric liquid crystal display layer and a translucent electroluminescent layer disposed beneath the cholesteric liquid crystal display layer defining a semitransparent display, wherein an object is visible from above the semitransparent display when the object is positioned beneath the semitransparent display;
a capacitive touch sensor disposed along the semitransparent display, wherein the semitransparent display comprises a top display section and a bottom display section, wherein the capacitive touch sensor is at least configured to detect objects contacting the bottom display section; and
control circuitry coupled to and configured to selectively actuate each of the cholesteric liquid crystal display layer and the translucent electroluminescent layer.

2. The semitransparent display of claim 1, wherein the cholesteric liquid crystal display layer is configured to operate in one of at least a planar mode, a focal-conic mode, or a homeotropic mode.

3. The semitransparent display of claim 2, wherein the control circuitry is configured to operate portions of the cholesteric liquid crystal display layer in one of the homeotropic mode or the focal-conic mode when the translucent electroluminescent layer is OFF.

4. The semitransparent display of claim 2, wherein the control circuitry is configured to operate portions of the cholesteric liquid crystal display layer in the planar mode, and other portions of the cholesteric liquid crystal display layer in one of the focal-conic mode or the homeotropic mode when the translucent electroluminescent layer is ON.

5. The semitransparent display of claim 2, wherein the control circuitry is configured to operate portions of the cholesteric liquid crystal display layer in the planar mode, and other portions of the cholesteric liquid crystal display layer in one of the focal-conic mode or the homeotropic mode when the translucent electroluminescent layer is OFF.

6. The semitransparent display of claim 5, wherein the semitransparent display comprises a top display section and a bottom display section, further wherein when the translucent electroluminescent layer is ON, light from the translucent electroluminescent layer projects through the bottom display section and through portions of the top display section where the cholesteric liquid crystal display layer is in one of the focal-conic mode or the homeotropic mode.

7. The semitransparent display of claim 1, wherein the translucent electroluminescent layer comprises an organic light emitting diode display.

8. The semitransparent display of claim 1, wherein the translucent electroluminescent layer comprises a transparent and segment electroluminescent display.

9. The semitransparent display of claim 1, wherein the semitransparent display comprises a transmissivity in a display region of at least twenty-five percent.

10. The semitransparent display of claim 1, wherein the cholesteric liquid crystal display layer comprises a single cholesteric liquid crystal layer having a pitch associated therewith configured to reflect a predetermined spectrum of light.

11. The semitransparent display of claim 1, further comprising a capacitive touch sensor disposed along the semitransparent display and coupled to the control circuitry.

12. The semitransparent display of claim 11, wherein the semitransparent display comprises a top display section and a bottom display section, wherein the capacitive touch sensor is at least configured to detect objects contacting the bottom display section.

13. The semitransparent display of claim 1, wherein the cholesteric liquid crystal display layer comprises a plurality of transparent electrodes disposed upon a substrate, wherein at least some of the plurality of transparent electrodes are configured as user actuation targets.

14. The semitransparent display of claim 1, wherein the cholesteric liquid crystal display is matrix addressable.

15. The semitransparent display of claim 1, further comprising an ambient light detector coupled to the control circuitry, wherein when ambient light detected by the ambient light detector is above a predetermined threshold, the control circuitry is configured to deactuate the translucent electroluminescent layer.

16. A portable electronic device comprising:
a cholesteric liquid crystal display layer and a translucent electroluminescent layer disposed beneath the cholesteric liquid crystal display layer defining a semitransparent display, wherein an object is visible from above the semitransparent display when the object is positioned beneath the semitransparent display;
a capacitive touch sensor disposed along the semitransparent display, wherein the semitransparent display comprises a top display section and a bottom display section, wherein the capacitive touch sensor is at least configured to detect objects contacting the bottom display section; and
control circuitry coupled to and configured to selectively actuate each of the cholesteric liquid crystal display layer and the translucent.

17. The portable electronic device of claim 16, wherein the cholesteric liquid crystal display layer comprises a single layer cholesteric liquid crystal display layer having a transmissivity of fifty percent or more when the cholesteric liquid crystal display layer is in a focal-conic mode or a homeotropic mode.

* * * * *